(12) United States Patent
Chenevier et al.

(10) Patent No.: US 10,676,818 B2
(45) Date of Patent: Jun. 9, 2020

(54) METHOD FOR PRODUCING SILICON NANOWIRES

(71) Applicant: Commissariat A L'energie Atomique Et Aux Energies Alternatives, Paris (FR)

(72) Inventors: Pascale Chenevier, La Tronche (FR); Peter Reiss, Saint Egreve (FR); Olga Burchak, Meylan (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 326 days.

(21) Appl. No.: 15/316,913

(22) PCT Filed: Jun. 12, 2015

(86) PCT No.: PCT/IB2015/054476
§ 371 (c)(1),
(2) Date: Jan. 9, 2017

(87) PCT Pub. No.: WO2015/189827
PCT Pub. Date: Dec. 17, 2015

(65) Prior Publication Data
US 2017/0114454 A1   Apr. 27, 2017

(30) Foreign Application Priority Data
Jun. 13, 2014 (FR) .................... 14 55431

(51) Int. Cl.
| | | |
|---|---|---|
| *C23C 16/24* | (2006.01) | |
| *C01B 33/029* | (2006.01) | |
| *H01M 4/38* | (2006.01) | |
| *C30B 25/00* | (2006.01) | |
| *C30B 29/06* | (2006.01) | |
| *H01G 11/30* | (2013.01) | |
| *C30B 11/12* | (2006.01) | |
| *C01B 33/027* | (2006.01) | |
| *C30B 29/60* | (2006.01) | |
| *C23C 16/01* | (2006.01) | |
| *C23C 16/44* | (2006.01) | |
| *C30B 29/62* | (2006.01) | |
| *H01M 10/0525* | (2010.01) | |
| *B82Y 40/00* | (2011.01) | |
| *H01M 10/052* | (2010.01) | |

(52) U.S. Cl.
CPC ............ *C23C 16/24* (2013.01); *C01B 33/027* (2013.01); *C01B 33/029* (2013.01); *C23C 16/01* (2013.01); *C23C 16/44* (2013.01); *C30B 11/12* (2013.01); *C30B 25/005* (2013.01); *C30B 29/06* (2013.01); *C30B 29/60* (2013.01); *C30B 29/62* (2013.01); *H01G 11/30* (2013.01); *H01M 4/386* (2013.01); *H01M 10/0525* (2013.01); *B82Y 40/00* (2013.01); *C01P 2004/16* (2013.01); *C01P 2006/40* (2013.01); *H01M 10/052* (2013.01); *Y02E 60/13* (2013.01)

(58) Field of Classification Search
CPC ...................................................... C23C 16/24
See application file for complete search history.

(56) References Cited

U.S. PATENT DOCUMENTS

| | | | | |
|---|---|---|---|---|
| 6,322,713 B1 * | 11/2001 | Choi | ................ | B82Y 10/00 |
| | | | | 216/38 |
| 2011/0309306 A1 * | 12/2011 | Zhou | ................ | B82Y 40/00 |
| | | | | 252/500 |

FOREIGN PATENT DOCUMENTS

| | | |
|---|---|---|
| EP | 1 087 413 A2 | 3/2001 |
| EP | 2 246 298 | 11/2010 |
| FR | 2 989 838 | 10/2013 |
| WO | WO 2011/137446 | 11/2011 |

OTHER PUBLICATIONS

Schmid et al. "Patterned epitaxial vapor-liquid-solid growth of silicon nanowires on Si(111) using silane" (2008).*
Kawashima, Takahiro, et al., *Control of Surface Migration of Gold Particles on Si Nanowires*, Nano Letters, vol. 8, No. 1, pp. 362-368, Jan. 1, 2008.
International Search Report and Written Opinion for corresponding International Application No. PCT/IB2015/054476, dated Sep. 4, 2015.

* cited by examiner

*Primary Examiner* — Austin Murata
(74) *Attorney, Agent, or Firm* — Alston & Bird LLP

(57) ABSTRACT

A method for producing a material based on silicon nanowires is provided. The method includes the steps of: i) bringing into contact, in an inert atmosphere, a sacrificial support based on a halogenide, a carbonate, a sulfate or a nitrate of an alkali metal, an alkaline earth metal or a transition metal having metal nanoparticles, with the pyrolysis vapours of a silicon source having a silane compound, by which silicon nanowires are deposited on the sacrificial support; and optionally ii) eliminating the sacrificial support and recovering the silicon nanowires produced in step ii).

7 Claims, 3 Drawing Sheets

METHOD FOR PRODUCING SILICON NANOWIRES

FIELD

The present invention relates to a process for the preparation of a material based on silicon nanowires, to the materials obtainable by this process and to their use in particular in lithium batteries, in supercapacitors, in thermoelectric devices for energy recovery or for cooling, in electronic detectors of chemical or biological substances in the gas or liquid phase.

BACKGROUND

Silicon has been studied for a long time as anode material for lithium batteries[1] because of its exceptional ability to accumulate lithium, which results in a very high energy density by weight, which can theoretically reach 3700 mAh/g. Crystalline silicon powder in the form of microparticles is furthermore a relatively inexpensive material which is a byproduct of the CMOS electronics industry. However, lithium batteries based on silicon anodes show a large fall in the electrical storage capacity after a small number of charge/discharge cycles because in particular of the fracturing of the silicon due to the lithiation/delithiation cycles[2] and of the loss of electrical connection with a major portion of the silicon of the anode[3].

In order to limit the loss of charge, the silicon can be introduced in the form of nanoparticles[1]. However, the electrical contact of the nanoparticles with the electrode has to be ensured by the addition of a conductive component, such as carbon black. During the cycles, a portion of the nanoparticles losses contact with the electrode[3].

The use of silicon nanowires[4] makes it possible to retain a high energy density by weight, to prevent fracturing of the silicon and to retain a good electrical contact of the silicon with the electrode by virtue of the elongated shape of the nanowires, which promotes network contacts.

In supercapacitors, the electrodes comprising silicon nanowires also represent an advantageous alternative to carbon as they show a high specific surface[5], a high conductivity if the nanowires are (ultra)doped[6], and a high chemical stability to cycling even with high voltages[7], which ensures a high energy density stored in the supercapacitor.

Of course, the silicon nanowires have to be specially synthesized for the application, in contrast to silicon nanopowders recovered as cheap industrial byproduct. It is thus important for any industrial application of this material to develop a synthesis appropriate for the large scale and having a low cost.

Several strategies have been developed for the synthesis of silicon nanowires:

1/ micromanufacture by etching of a bulk silicon block[8],
2/ synthesis of thin layer type by CVD (Chemical Vapor Deposition)[9],
3/ volume-based chemical synthesis in the liquid phase[10] or supercritical phase[11],
4/ vapor phase chemical synthesis[12] over substrate,
5/ gas phase pyrolytic synthesis[13] over substrate.

The majority of the methods described (cases 1/, 2/, 4/ and 5/) produce silicon nanowires as a thin film at the surface of the substrate, the weight of the nanowires produced being very low (a few μg at the best). The production yield, understood as the weight of silicon in the form of nanowires with respect to the weight of silicon used in the process, is very low (<<1%); the production cost is thus very high.

The volume-based chemical liquid-phase synthesis[10] and in the supercritical phase[11] (case 3/) provided by the team of Pr B. A. Korgel make it possible to obtain a larger amount of silicon nanowires. These methods have also been described in the international application WO 2011/156019. The yield is high (60%) in the case of the supercritical-phase synthesis alone; it is low in the liquid-phase synthesis (<5%). However, the liquid-phase synthesis uses a highly pyrophoric reactant, requiring handling in a glovebox; the supercritical-phase synthesis is based on an expensive process under high pressure which is difficult to adapt industrially. Furthermore, these methods have not made it possible to date to dope the nanowires during the synthesis.

Finally, the pyrolytic synthesis provided by Pr S. B. Rananavare[13] makes possible a bulk synthesis using, as synthesis substrate, a sacrificial porous material, chalk or glass wool. The silicon nanowires obtained according to this synthesis have diameters of the order of 20 to 100 nm. In this type of synthesis, the diameter of the nanowires is determined by the diameter of the catalyst nanoparticles. Although the gold nanoparticles used in this study have small diameters of 5 to 10 nm, they diffuse under the effect of the heat to the surface of the support and amalgamate, which results in the formation of nanoparticles with greater diameters and thus in the growth of nanowires with a diameter of 20 to 100 nm.

SUMMARY

There has now been developed a process for the synthesis of silicon nanowires based on the principle of the vapor-phase pyrolytic synthesis but using, as sacrificial support, an alkali metal, alkaline earth metal or transition metal halide, carbonate, sulfate or nitrate, in particular sodium chloride (cooking salt), which is advantageously soluble in water.

Unexpectedly, it has been shown that this sacrificial support advantageously limits the diffusion of the nanoparticles catalyzing the growth of the nanowires. The result of this is that the catalyst nanoparticles remain small in size, so that the silicon nanowires obtained according to the process of the invention have a homogeneous diameter of 12±3 nm, i.e. a diameter far smaller than what has been described in the prior art. Furthermore, they exhibit lengths of 0.5 to 5 microns and thus a high aspect ratio of 50 to 500, the aspect ratio being defined as the length of the object with respect to its diameter. This quality confers a very high specific surface on the material. The active surface of the electrode is thus higher for one and the same volume or one and the same weight as another type of electrode, which increases the current density of the device.

In addition, as another advantage, this sacrificial support is removed in water, without a dangerous reactant and without risk of degradation of the surface of the nanowires. Thus, the nanowires are recovered pure in the form of a black powder by simple washing with water, with a reproducible synthesis yield, generally of the order of 15%, much greater than the yields of the conventional vapor-phase syntheses.

This material can be obtained in the powder form in a large amount (batches of 50 mg on the laboratory scale) for a low synthesis cost by virtue of a synthesis method based on inexpensive reactants which are stable in air (such as phenylsilane or diphenylsilane, gold nanoparticles and cooking salt) and on a short heat treatment at a moderate temperature (typically one hour at 450° C.). The material can be easily suspended in different solvents for shaping by simple and inexpensive techniques of the state of the art, for example coating. The material is thus easily industrializable on a large scale in objects of everyday life, such as rechargeable batteries.

Finally, the silicon nanowires are obtained reproducibly in the form of a collection of nanowires with diameters which are very homogeneous and constant from one batch to another. This characteristic of homogeneity ensures an unvarying quality in manufacture of the material and of the electrodes which contain them.

Furthermore, the process is easy to implement and can easily be operated industrially as it uses products which are stable in air. Furthermore, it makes it possible to obtain silicon nanowires in an industrial amount.

Thus, a first subject matter of the invention relates to a process for the preparation of a material based on silicon nanowires, comprising the stages of:

i) bringing a sacrificial support based on an alkali metal, alkaline earth metal or transition metal halide, carbonate, sulfate or nitrate, comprising a catalyst consisting of metal nanoparticles, on the one hand, into contact, under an inert atmosphere, with the pyrolysis vapors from a silicon source comprising a silane compound, on the other hand, whereby silicon nanowires deposited on said sacrificial support are obtained; and optionally ii) removing the sacrificial support and recovering the silicon nanowires obtained in stage i).

Stage i)

Within the meaning of the present description, the term "based on an alkali metal, alkaline earth metal or transition metal halide, carbonate, sulfate or nitrate" means consisting of or predominantly comprising, in particular more than 50% by weight of, especially more than 75% by weight of, an alkali metal, alkaline earth metal or transition metal halide.

The sacrificial support based on an alkali metal, alkaline earth metal or transition metal halide, carbonate, sulfate or nitrate can in particular be chosen from KCl, $MgCl_2$, $CaCl_2$, $Na_2CO_3$, $MgCO_3$, $K_2CO_3$, $Na_2SO_4$, $CaSO_4$, $MgSO_4$, $K_2SO_4$ or $Ca(NO_3)_2$. It is preferably based on sodium chloride or on calcium carbonate, in particular on sodium chloride. According to a preferred alternative form, the sacrificial support is in the powder form.

The sacrificial support based on an alkali metal, alkaline earth metal or transition metal halide, carbonate, sulfate or nitrate is typically prepared by grinding said anhydrous halide by means, for example, of a grinding cylinder comprising zirconia beads. The powder of said alkali metal, alkaline earth metal or transition metal halide, carbonate, sulfate or nitrate consists of particles, the diameter of which is between 10 nm and 50 µm, in particular between 50 nm and 50 µm, especially between 1 µm and 50 µm, in particular approximately 10 µm. This size advantageously makes it possible to limit the fusion of the catalyst particles and thus to limit the formation of nanowires having a large diameter. The alkali metal, alkaline earth metal or transition metal halide, carbonate, sulfate or nitrate powder is preferably stored under anhydrous conditions.

The metal nanoparticles are in particular nanoparticles of a metal catalyst, in particular nanoparticles of a metal, of a bimetallic compound or of a metal oxide. The nanoparticles of a metal are in particular nanoparticles of gold, cobalt, nickel, bismuth, tin, manganese or iridium. The nanoparticles of a bimetallic compound are in particular nanoparticles of $MnPt_3$ or FePt. The nanoparticles of a metal oxide are in particular nanoparticles of ferric oxide ($Fe_2O_3$).

The catalyst preferably consists of gold nanoparticles. The gold nanoparticles employed in the process according to the invention can be synthesized according to the process of the state of the art described in the paper by Brust et al.[14].

The diameter of the catalyst nanoparticles can be between 1 and 10 nm and is in particular from 1 to 2 nm. The surface of the catalyst nanoparticles can be covered with a ligand, such as dodecanethiol.

The catalyst nanoparticles can be dispersed in a solvent, such as toluene, in particular at a concentration of 50 mg/ml, in order to constitute a mother solution of catalyst nanoparticles.

Typically, the mother solution of catalyst nanoparticles is added to the sacrificial salt support in an anhydrous nonpolar solvent, such as anhydrous hexane. After removal of the solvent under a stream of inert gas, the solid obtained can be ground under an inert atmosphere.

According to stage i), the sacrificial support is brought into contact with the pyrolysis vapors from a silicon source comprising a silane compound under an inert atmosphere.

Stage i) is carried out in particular at a temperature of between 300 and 1300° C., in particular at 450° C. Within this temperature range, the silicon support undergoes pyrolysis, that is to say a thermal decomposition, resulting in the formation of pyrolysis vapors which, on contact with the sacrificial support, will result in the growth of silicon nanowires on the sacrificial support.

The silicon source comprises a silane compound or a mixture of silane compounds. The silane compound is in particular an organosilane, especially an organomonosilane, an organodisilane or an organotrisilane, or a simple silane of the formula $Si_nH_{(2n+1)}$ with n ranging from 1 to 10. The organosilane can in particular be a mono-, di- or triarylsilane, such as monophenylsilane, diphenylsilane or triphenylsilane, or a mono-, di- or trialkylsilane, such as octylsilane.

The contacting operation in stage i) is carried out under an inert atmosphere, that is to say in the absence of oxygen, and under anhydrous conditions, in particular under vacuum or under a stream of an inert gas, such as argon or nitrogen.

According to an embodiment, the operation in which the sacrificial support and the pyrolysis vapors are brought into contact in stage i) is carried out in the presence of a doping agent. The doping agent can be chosen from organophosphines, such as diphenylphosphine, organoboranes such as triphenylborane or diphenylboronic anhydride, organoarsines or aromatic amines, such as diphenylamine or triphenylamine.

Stage ii)

Stage ii) consists in removing the sacrificial support in order to recover the optionally doped support-free silicon nanowires. This stage comprises in particular a stage of washing with water the silicon nanowires obtained by growth on the sacrificial support in stage i).

Stage iii)

According to one embodiment, the process according to the invention additionally comprises a stage iii) of coating the surface of the silicon nanowires obtained in stage ii) or in stage i) with an organic or inorganic functional layer. These nanowires can be functionalized, for example, with a layer of silicon oxide according to the process described by Berton et al.[7], or with a layer of polymer according to the electrochemical process described by Aradilla et al.[15], or with a layer of diamond according to the process in the international application WO 2013057218.

Stage iv)

According to another embodiment, the silicon nanowires resulting from stages ii) and/or iii) are deposited on a support, in particular a support which is a conductor or semiconductor. By way of example, the powder of silicon nanowires (1 mg) is suspended in 50 μl of chloroform by stirring in an ultrasonic bath. The suspension is deposited dropwise on a silicon substrate until the solvent has completely evaporated. After drying, the silicon nanowires form a porous homogeneous layer with a thickness of 25 μm on the substrate.

Stage v)

According to another embodiment, the silicon nanowires resulting from stages ii) and/or iii) are assembled in order to form a self-supported material, such as a felt of silicon nanowires. By way of example, the powder of silicon nanowires is suspended in chloroform as described above. The suspension is filtered through a filtering membrane, optionally in a vacuum filtration device. After drying, the film of silicon nanowires detached from the filter constitutes a porous material. As second example, the powder of silicon nanowires is compressed to give a pellet in a hydraulic press. The pellet constitutes a nanostructured material of interest as a thermoelectric material.

The synthesis of the silicon nanowires according to the process of the invention can be carried out in batches, as in the example below, or in a continuous or semicontinuous stream.

For a synthesis in semicontinuous mode, the sacrificial salt support carrying the catalyst nanoparticles can be placed in a growth chamber and exposed, by opening a valve, to another chamber containing the pyrolyzed silicon source.

For a continuous synthesis, the sacrificial salt support carrying the catalyst nanoparticles can pass at a controlled rate through the growth chamber and be exposed to the vapors exiting from a chamber for the pyrolysis of the silicon support. The methods on a fluidized bed or on a conveyor belt are suitable for the synthesis of the nanowires of the invention.

Material Based on Silicon Nanowires

Another subject matter of the invention relates to a material based on silicon nanowires obtainable by the process as defined above.

"Material based on silicon nanowires" is understood to mean a material comprising or consisting of silicon nanowires. It may be a matter in particular of doped or undoped silicon nanowires deposited on the sacrificial support, as obtained in stage i), or without a support, as recovered in stage ii), covered or not covered with a surface coating according to stage iii), deposited on any other support of interest according to stage iv), or assembled in order to form a self-supported material according to stage v).

This material can be characterized in that the silicon nanowires exhibit a diameter of less than 20 nm and a length of greater than 500 nm.

The size of the nanowires, in particular their diameter and/or their length, can be measured according to conventional techniques, such as scanning electromicroscopy and transmission electromicroscopy.

The silicon nanowires have in particular a diameter of between 9 nm and 15 nm, especially of 12 nm±3 nm. Typically, this diameter is homogeneous over the whole of the silicon nanowires, that is to say that a standard deviation of less than 30% is observed in the distribution of the diameters.

The silicon nanowires have in particular a length of between 500 nm and 5 μm.

The silicon nanowires according to the invention advantageously exhibit a high degree of purity, in particular no impurity related to the support, as a result in particular of the soluble nature of the sacrificial support.

Use of the silicon nanowires

Another subject matter of the present patent application relates to the use of a material based on silicon nanowires as defined above in the preparation of electrodes for lithium batteries, supercapacitors, thermoelectric devices or electronic detectors of chemical or biological substances.

In the case of lithium batteries, the combination of the characteristics of great length, of high specific surface and of homogeneous small diameters is particularly attractive. This is because, during the charging of the battery, the silicon connected to the electrode can absorb very large amounts of lithium, until the $Li_{15}Si_4$ phase is formed. A silicon particle then experiences an increase in its volume by a factor of 4, which causes high tensions at the surface of the particle. Beyond a critical size of the order of 200 nm, the particle fractures under the effect of the mechanical stress. During the discharging of the battery, the delithiation brings about a reduction in the volume but the fractured particles remain separated[1]. The fractured pieces which are no longer connected electrically to the electrode no longer participate in the charge/discharge cycles and the capacity of the battery decreases.

The silicon nanowires according to the invention exhibit a great length and a high aspect ratio, which implies that they advantageously form a conductive percolating network once deposited on a surface. In this network, all the silicon nanowires according to the invention are electrically connected by contact with the other nanowires and can thus participate in the charging/discharging. Furthermore, the silicon nanowires according to the invention have a sufficiently thin diameter to prevent fracturing and thus the capacity of the battery will be preserved during the cycles. Of course, the qualities of low cost and of simple implementation in the form of a liquid suspension are also important assets in the industrial manufacture of the batteries.

The materials based on silicon nanowires according to the invention are useful in particular in the preparation of anodes for lithium-metal, lithium-ion, lithium-air or lithium-sulfur batteries or other technologies of lithium or sodium batteries.

In the case of supercapacitors, the electrodes based on silicon nanowires withstand high tensions and show a high stability to cycling. The current density increases when the diameter of the nanowires decreases[5]. The silicon nanowires according to the invention advantageously make it possible to obtain greater current densities by virtue of their very thin diameter.

The materials based on silicon nanowires according to the invention are thus useful in particular in the preparation of anodes and/or cathodes of supercapacitors, micro-supercapacitors or ultramicrocapacitors.

The material based on silicon nanowires according to the invention can also be used in applications in thermoelectric devices for energy recovery or for cooling. This is because thermoelectric materials have to possess, simultaneously, a high Seebeck coefficient, a good electrical conductivity and a low thermal conductivity. Silicon is an advantageous thermoelectric material when it is highly doped by virtue of a strong electrical conductivity and a high Seebeck coefficient. However, the performances can be improved if the thermal conductivity is reduced. Specifically, the thermal conductivity of the silicon nanowires is reduced by at least a factor of 10 if the diameter of the nanowires is less than 20 nm[3], which is the case with the silicon nanowires according to the invention.

The silicon nanowires according to the invention, optionally as a mixture with other components, and compressed to give a bulk thermoelectric material are useful in particular in the preparation of a Peltier cooling unit or thermoelectric generator for thermal energy recovery.

The material based on silicon nanowires is furthermore useful in the preparation of a sensitive conductor support of a chemical detector which is resistive, capacitive or in field-effect transistor mode.

Another subject matter of the invention relates to the use of sodium chloride as sacrificial support in the preparation of a material based on silicon nanowires.

Definitions

"Nanowire" is understood to mean a wire, the diameter of which is less than 100 nm, in particular between 1 and 50 nm. The silicon nanowires obtained according to the process of the invention advantageously have a diameter of between 1 and 30 nm, in particular between 5 and 20 nm, especially between 8 and 15 nm.

"Sacrificial support" is understood to mean a temporary support necessary for the synthesis of the silicon nanowires but intended to or which can be removed after the formation of the silicon nanowires at its surface.

DETAILED DESCRIPTION

EXAMPLES

Example 1

Synthesis of a Batch of Undoped Silicon Nanowires

1/ The gold nanoparticles are synthesized according to the process of the state of the art described in the paper by Brust et al.[14]. Their diameter is from 1 to 2 nm and their surface is covered with dodecanethiol. They are dispersed in toluene at a concentration of 50 mg/ml in order to constitute the gold nanoparticles mother solution.

2/ The sacrificial salt support is prepared by grinding anhydrous sodium chloride. 200 g of anhydrous sodium chloride are placed in a grinding cylinder comprising zirconia beads. The cylinder is closed and rotated for 24 h. The salt powder obtained has a mean size of 10 µm. It is stored with exclusion of the air.

3/ 40 µl of gold nanoparticles mother solution are mixed with 1 g of sacrificial salt support in 20 ml of dry hexane. The hexane is evaporated under a stream of inert gas (argon or nitrogen) in 3 h. The dry solid is transferred into a mortar and finely ground with a pestle under an inert atmosphere. The powder is deposited in an alumina crucible.

Figure 1:
FIG. 1: Scanning electron microscopy image of the silicon nanowires of the invention.

4/ The reactor is a tube with an external diameter of 16 mm made of pyrex with a thickness of 1 mm, comprising two constrictions at 3 cm and 6 cm from the bottom approximately. In the bottom of the reactor (on the left in FIG. 1), 184 mg of diphenylsilane $Si(C_6H_5)_2H_2$, i.e. 1 mmol, are deposited and then, on the top of the reactor (on the right in FIG. 1), the crucible containing the sacrificial support impregnated with gold nanoparticles is deposited. The reactor is subsequently placed on a vacuum line and sealed with a blow torch at 10 cm from the bottom approximately.

5/ The reactor is placed in an oven at 450° C. for 1 h and then it is removed from the oven and left to cool to ambient temperature over 30 minutes. The reactor is broken open under ambient conditions.

6/ The sacrificial salt support covered with silicon nanowires is transferred from the crucible into a 40 ml plastic centrifuge tube with 5 ml of chloroform. The suspension in chloroform is washed three times with 30 ml of water under ultrasound with an ultrasonic bath.

7/ 20 ml of ethanol are added to the suspension of silicon nanowires in chloroform. The mixture is passed through the ultrasonic bath and then centrifuged at 8000 rpm for 5 minutes, and the solvent is removed and replaced with 20 ml of ethanol and 5 ml of chloroform. This washing operation is repeated 3 times.

Finally, the solid obtained consists of 5 to 10 mg of silicon nanowires ready for use.

Example 2

Synthesis of Doped Nanowires

Stages 3/ to 7/ described above are repeated with the sole modification being that, in stage 4/, diphenylphosphine $P(C_6H_5)_2H$ is introduced as a mixture in the diphenylsilane in a proportion of 0.1 to 3% by weight.

Example 3

Preparation of the Electrodes for Lithium Batteries 54 mg of undoped silicon nanowires are ground in a mortar with 7 mg of carbon black and 7 mg of carboxymethylcellulose in water (1 ml).

The paste obtained is deposited by coating on a metal film at 0.8 mg/cm$^2$ and dried at 60° C. under vacuum for 6 h.

The electrode is fitted as a cathode in a lithium battery, with a Viledon separator impregnated with an electrolyte consisting of a solution of $LiPF_6$ in a 1/1 mixture by weight of ethylene carbonate and diethyl carbonate, against a lithium-metal anode. The combination is sealed in a button cell.

Figure 2:
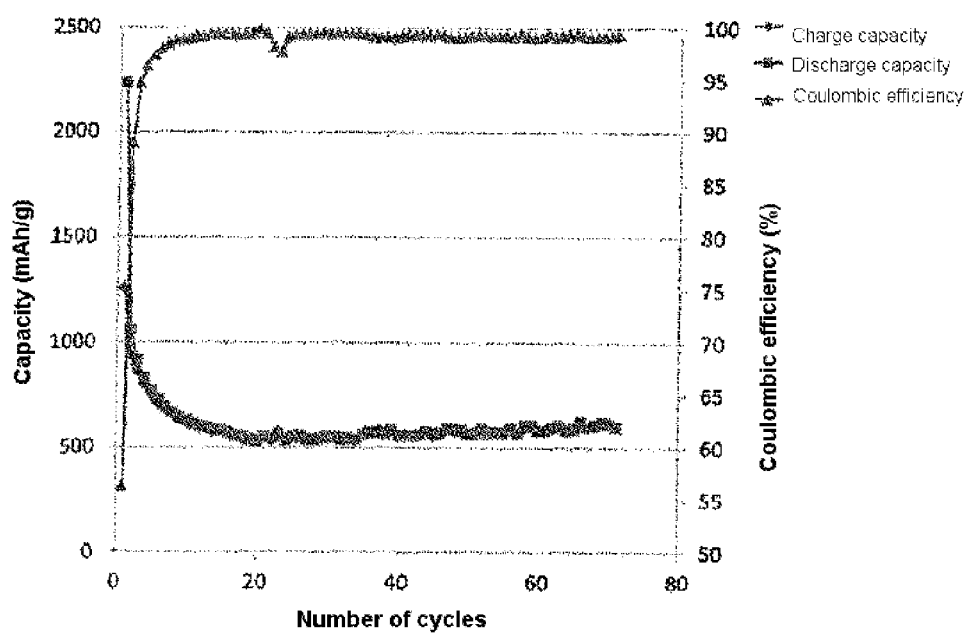
FIG. 2: Charge and discharge capacity with respect to the weight of the electrode and columbic efficiency of a lithium-metal battery having an electrode based on the silicon nanowires according to the invention, according to example 3.

The lithium battery is tested in discharge/charge cycles over 70 cycles at a rate of C/20 in the first cycle and C/5 in the following cycles. By definition, a charge rate of C/20 (C/5 respectively) indicates that the battery is completely charged in ½0 hour (⅕ hour respectively). The charge and discharge capacity, with respect to the weight of silicon nanowires/carbon black/carboxymethylcellulose composite, is shown in FIG. 2 as a function of the number of cycles. The figure shows that, despite the initial fall in capacity due to the formation of a passivation layer on the silicon nanowires, the capacity of the battery stabilizes from the 20$^{th}$ cycle and subsequently remains constant over at least 50 cycles. This high stability demonstrates the excellent resistance of the silicon nanowires to the mechanical stresses imposed by the lithiation/delithiation cycling, in comparison with silicon nanopowders, which induce, in the lithium battery, a continuous fall in the capacity[3].

Example 4

Preparation of the Electrodes for a Supercapacitor 1 mg of doped silicon nanowires are suspended in 200 µl of chloroform. A 1 cm² piece of ultradoped silicon wafer is stripped by dipping in a 10% by weight aqueous hydrofluoric acid solution. The suspension of silicon nanowires of the invention is deposited on this substrate. The deposit is dried in ambient air. Two identical electrodes are prepared for the manufacture of a supercapacitor. The two electrodes according to the invention are assembled as a sandwich one face to the other, separated by a Whatman filter paper separator impregnated with electrolyte consisting of the ionic liquid 1-methyl-1-propylpyrrolidinium bis(trifluoromethylsulfonyl)imide. The supercapacitor is assembled in an inert atmosphere.

Figure 3:
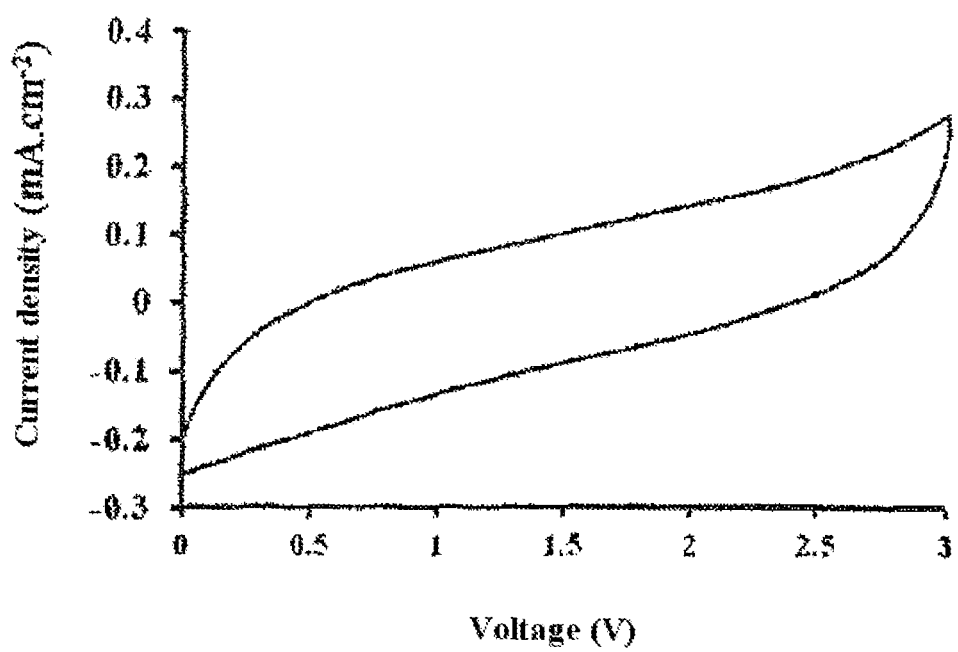
FIG. 3: Cyclic voltammogram of a supercapacitor consisting of two electrodes comprising silicon nanowires, according to example 4.

The capacitive behavior of the supercapacitor is tested by cyclic voltammetry. The voltammogram presented in FIG. 3 shows a virtually ideal capacitive behavior within a wide voltage window of 3 V.

Figure 4:
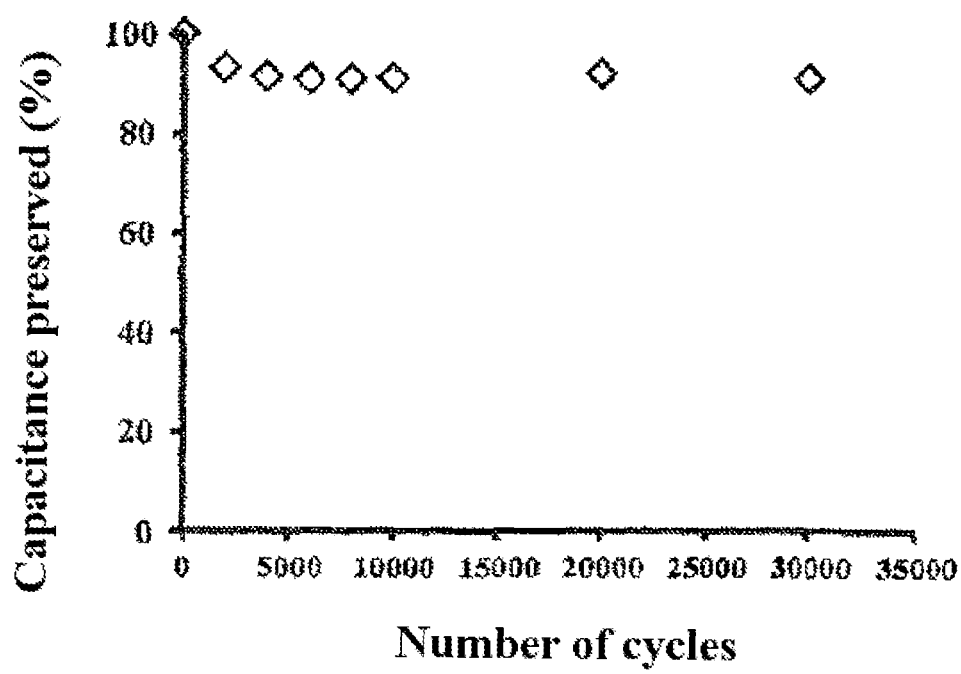
FIG. 4: Change in the capacitance of the supercapacitor of example 4 with the number of charge/discharge cycles.

The stability to cycling is measured by cycling the supercapacitor over a window of 2.5 V over 30 000 cycles, under a current density of 0.050 mA/cm². The initial capacitance of the supercapacitor is 17 µF/cm². The change in the capacitance as a function of the number of cycles is given in FIG. 4. The capacitance of supercapacitor is remarkably stable with a fall of barely 7% in the first 3000 cycles and then an unvarying capacitance over time.

Example 5

Synthesis of a Batch of Undoped Silicon Nanowires on Calcium Carbon Nanoparticles 1/ The gold nanoparticles are synthesized according to the process of the state of the art described in the paper by Brust et al.[14]. The diameter is from 1 to 2 nm and their surface is covered with dodecanethiol. They are dispersed in toluene at a concentration of 50 mg/ml in order to constitute the gold nanoparticles mother solution.

2/ The sacrificial support of calcium carbonate nanoparticles is a commercial product which has an appearance of a white powder with the mean nanoparticle size of 67 nm. The product is stored with exclusion of moisture.

3/ 20 µl of gold nanoparticles mother solution are mixed with 200 mg of sacrificial support of calcium carbonate nanoparticles in 20 ml of dry hexane. After stirring for 30 min, the hexane is evaporated using a rotary evaporator. The dry solid is transferred into an alumina crucible. All the handling operations of this part are carried out in the open air.

Stages 4/ and 5/ described in example 1 are repeated with the sole modification being that, in stage 4/, 368 mg of diphenylsilane $Si(C_6H_5)_2H_2$, i.e. 2 mmol, are used.

6/ The sacrificial support of calcium carbonate nanoparticles is transferred from the crucible into a 40 ml plastic centrifuge tube with 5 ml of chloroform. The suspension is washed three times with 20 ml of the aqueous hydrochloric acid HCl solution (1 M) and then twice with 20 ml of water under ultrasound in the ultrasonic bath.

Stage 7/ is repeated.

Finally, the solid obtained consists of 17 to 20 mg of silicon nanowires which are ready for use.

Example 6

Synthesis of a Batch of Doped Silicon Nanowires on Calcium Carbonate Nanoparticles Stages 4/ to 7/ described in example 5 are repeated with the sole modification being that, in stage 4/, diphenylphosphine $P(C_6H_5)_2H$ is introduced as a mixture in the diphenylsilane $Si(C_6H_5)_2H_2$ in a proportion of 0.1 to 3% by weight.

REFERENCES

[1] U. Kasavajjula, C. Wang and A. J. Appleby, *Journal of Power Sources*, 2007, 163, 1003-1039.

[2] X. H. Liu, H. Zheng, L. Zhong, S. Huang, K. Karki, L. Q. Zhang, Y. Liu, A. Kushima, W. T. Liang, J. W. Wang, J. H. Cho, E. Epstein, S. A. Dayeh, S. T. Picraux, T. Zhu, J. Li, J. P. Sullivan, J. Cumings, C. Wang, S. X. Mao, Z. Z. Ye, S. Zhang and J. Y. Huang, *Nano. Lett.*, 2011, 11, 3312-3318.

[3] J. H. Ryu, J. W. Kim, Y. E. Sung and S. M. Oh, *Electrochemical and Solid-State Letters*, 2004, 7, A306-A309.

[4] C. K. Chan, H. Peng, G. Liu, K. McIlwrath, X. F. Zhang, R. A. Huggins and Y. Cui, *Nature Nanotechnology*, 2008, 3, 31-35.

[5] F. Thissandier, L. Dupre, P. Gentile, T. Brousse, G. Bidan, D. Buttard and S. Sadki, *Electrochimica Acta*, 2014, 117, 159-163.

[6] F. Thissandier, N. Pauc, T. Brousse, P. Gentile and S. Sadki, *Nanoscale Research Letters*, 2013, 8, 1-5.

[7] N. Berton, M. Brachet, F. Thissandier, J. Le Bideau, P. Gentile, G. Bidan, T. Brousse and S. Sadki, *Electrochemistry Communications*, 2014, 41, 31-34.

[8] K. -Q. Peng, X. Wang, L. Li, Y. Hu and S. -T. Lee, *Nano Today*, 2013, 8, 75-97.

[9] F. Thissandier, A. Le Comte, O. Crosnier, P. Gentile, G. Bidan, E. Hadji, T. Brousse and S. Sadki, *Electrochemistry Communications*, 2012, 25, 109-111.

[10] A. T. Heitsch, D. D. Fanfair, H. -Y. Tuan and B. A. Korgel, Journal of the American *Chemical Society*, 2008, 130, 5436.

[11] A. M. Chockla, K. C. Klavetter, C. B. Mullins and B. A. Korgel, *Chemistry of Materials*, 2012, 24, 3738-3745.

[12] H. Geaney, T. Kennedy, C. Dickinson, E. Mullane, A. Singh, F. Laffir and K. M. Ryan, *Chemistry of Materials*, 2012, 24, 2204-2210.

[13] J. C. Chan, H. Tran, J. W. Pattison and S. B. Rananavare, *Solid State Electron.*, 2010, 54, 1185-1191.

[14] M. Brust, W. M., D. Bethell, D. J. Schiffrin and R. Whyman, *J. Chem. Soc., Chem. Comm.*, 1994, 801-802.

[15] D. Aradilla, G. Bidan, P. Gentile, P. Weathers, F. Thissandier, V. Ruiz, P. Gómez-Romero, T. J. S. Schubert, H. Sahin and S. Sadki, *RSC Advances*, 2014, in press.

The invention claimed is:

1. A process for the preparation of a material based on silicon nanowires, comprising the stages of:
   i) bringing a sacrificial support based on an alkali metal or alkaline earth metal halide, carbonate, sulfate or nitrate, comprising metal nanoparticles, into contact, under an inert atmosphere, with the pyrolysis vapors from a silicon source comprising a silane compound, whereby silicon nanowires deposited on the sacrificial support are obtained, the sacrificial support being obtained by mixing alkali metal or alkaline earth metal halide, carbonate, sulfate, or nitrate particles in an anhydrous nonpolar solvent, with the metal nanoparticles; and optionally ii) removing the sacrificial support and recovering the silicon nanowires obtained in stage i).

2. The process as claimed in claim 1, in which the sacrificial support is based on sodium chloride.

3. The process as claimed in claim 1, in which stage ii) comprises a stage of washing with water the silicon nanowires deposited on the sacrificial support.

4. The process as claimed in claim 1, in which stage i) is carried out in the presence of a doping agent.

5. The process as claimed in claim 4, in which the doping agent is chosen from organophosphines, organoarsines, organoboranes and aromatic amines.

6. The process as claimed in claim 1, in which the sacrificial support is a powder of an alkali metal or alkaline earth metal halide, carbonate, sulfate or nitrate, the diameter of the particles which is between 10 nm and 50 µm.

7. The process as claimed in claim 1, in which the silicon nanowires resulting from stages i) or ii) are deposited on a support which is a conductor or semiconductor.

\* \* \* \* \*